United States Patent [19]
Levinson et al.

[11] Patent Number: 6,098,408
[45] Date of Patent: Aug. 8, 2000

[54] SYSTEM FOR CONTROLLING REFLECTION RETICLE TEMPERATURE IN MICROLITHOGRAPHY

[75] Inventors: Harry J. Levinson, Saratoga; Khanh B. Nguyen, San Mateo, both of Calif.

[73] Assignee: Advanced Micro Devices, Sunnyvale, Calif.

[21] Appl. No.: 09/189,228

[22] Filed: Nov. 11, 1998

[51] Int. Cl.[7] .................................................. F25B 21/02
[52] U.S. Cl. ..................................... 62/3.2; 62/62; 62/3.7
[58] Field of Search ................................... 62/3.7, 32, 62

[56] References Cited

U.S. PATENT DOCUMENTS

| | | | |
|---|---|---|---|
| 5,689,957 | 11/1997 | DeVilbiss et al. | 62/3.7 |
| 5,689,958 | 11/1997 | Gaddis et al. | 62/3.7 |
| 5,690,849 | 11/1997 | DeVilbiss et al. | 219/497 |
| 5,822,993 | 10/1998 | Atty | 62/3.7 |
| 5,867,990 | 2/1999 | Ghoshal | 62/3.7 |
| 5,940,784 | 8/1999 | El-Husayni | 702/130 |

*Primary Examiner*—William Doerrler
*Assistant Examiner*—Mark Shulman
*Attorney, Agent, or Firm*—Amin, Eschweiler & Turocy, LLP

[57] ABSTRACT

A system for regulating reticle temperature is provided. The system includes a reticle for use in a lithographic process and a chuck assembly for supporting the reticle. The chuck assembly includes: a backplate having front and back surfaces, the front surface engaging with a backside of the reticle; and a thermoelectric cooling system operatively coupled to the backplate for regulating temperature of at least a portion of the reticle via heat conduction through the backplate. The chuck assembly also includes a temperature sensing system coupled to the backplate for sensing temperature of at least a portion of the reticle via heat conduction through the backplate; and a heat sink operatively coupled to the thermoelectric cooling system. A voltage driver operatively is coupled to the thermoelectric cooling system, the voltage driver provides a bias voltage to drive the thermoelectric cooling system. A processor is operatively coupled to the voltage driver, the processor employing the voltage driver in controlling the thermoelectric cooling system.

25 Claims, 8 Drawing Sheets

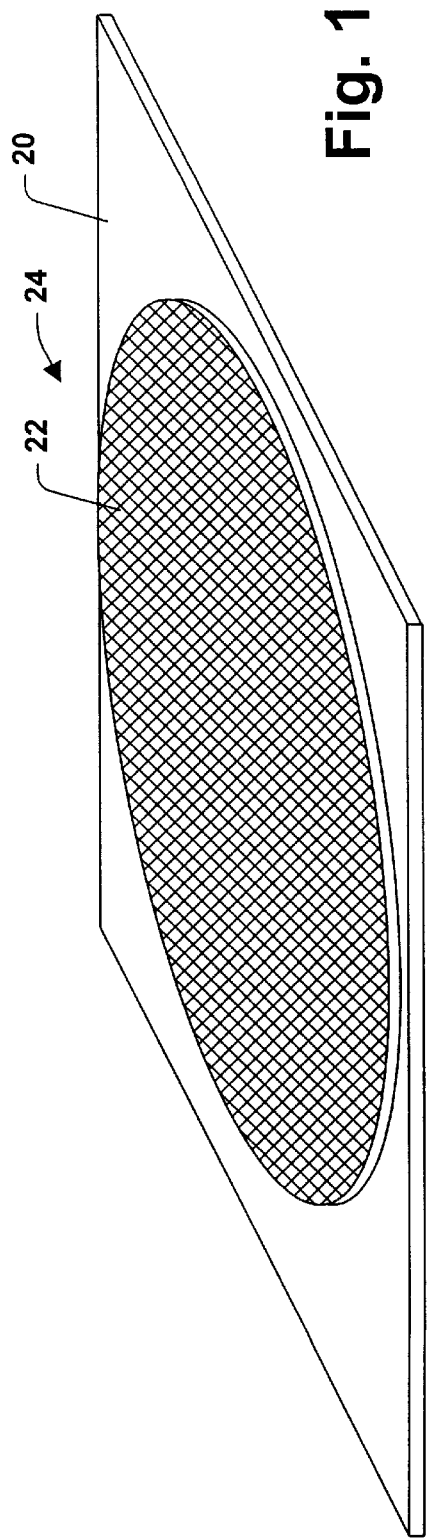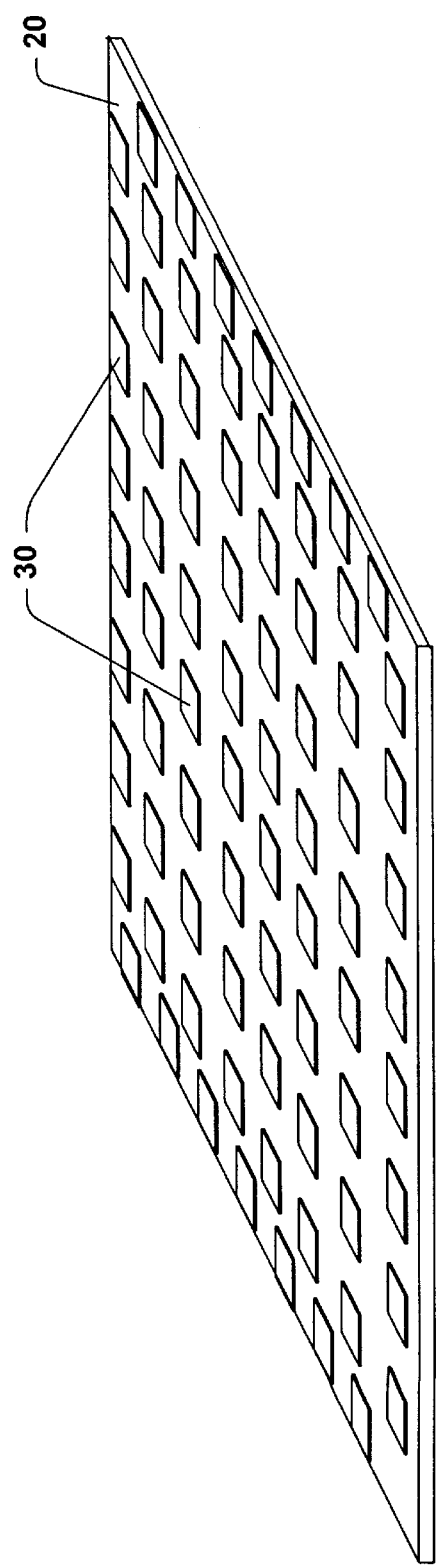

SYSTEM FOR CONTROLLING REFLECTION RETICLE TEMPERATURE IN MICROLITHOGRAPHY

TECHNICAL FIELD

The present invention generally relates to lithography, and in particular to a system for maintaining suitable reticle temperature in extreme ultraviolet (EUV) lithography.

BACKGROUND OF THE INVENTION

In the semiconductor industry, there is a continuing trend toward higher device densities. To achieve these high densities there has been and continues to be efforts toward scaling down the device dimensions on semiconductor wafers. In order to accomplish such high device packing density, smaller features sizes are required. This may include the width and spacing of interconnecting lines.

The requirement of small features with close spacing between adjacent features requires high resolution lithographic processes. In general, projection lithography refers to processes for pattern transfer between various media. It is a technique used for integrated circuit fabrication in which a silicon slice, the wafer, is coated uniformly with a radiation-sensitive film, the resist, and an exposing source (such as light, x-rays, or an electron beam) illuminates selected areas of the surface through an intervening master template, the mask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through a transparency causes the image area to become selectively crosslinked and consequently either more or less soluble (depending on the coating) in a particular solvent developer. The more soluble (i.e., uncrosslinked) or deprotected areas are removed in the developing process to leave the pattern image in the coating as less soluble polymer.

Projection lithography is a powerful and essential tool for microelectronics processing. As feature sizes are driven smaller and smaller, optical systems are approaching their limits caused by the wavelengths of the optical radiation. A recognized way of reducing the feature size of circuit elements is to lithographically image them with radiation of a shorter wavelength. "Long" or "soft" x-rays (a.k.a, extreme ultraviolet (EUV)), wavelength range of lambda=50 to 700 Angstroms (Å) are now at the forefront of research in an effort to achieve the smaller desired feature sizes.

EUV lithography may be carried out as follows, EUV radiation is projected onto a resonant-reflective reticle. The resonant-reflective reticle reflects a substantial portion of the EUV radiation which carries an IC pattern formed on the reticle to an all resonant-reflective imaging system (e.g., series of high precision mirrors). A demagnified image of the reticle pattern is projected onto a resist coated wafer. The entire reticle pattern is exposed onto the wafer by synchronously scanning the mask and the wafer (i.e., a step-and-scan exposure).

Although EUV lithography provides substantial advantages with respect to achieving high resolution patterning, errors may still result from the EUV lithography process. For instance, the reflective reticle employed in the EUV lithographic process is not completely reflective and consequently will absorb some of the EUV radiation. The absorbed EUV radiation results in heating of the reticle. As the reticle increases in temperature, mechanical distortion of the reticle may result due to thermal expansion of the reticle. Such mechanical distortion of the reticle manifests in overlay errors. In photolithography, overlay is defined as layer to layer registration performance. For example, silicon is a material which may be used as a substrate for a reticle, and silicon has a coefficient of thermal expansion of approximately 2 ppm/°C. Across a typical 100 mm image field, a 0.5° C. deviation in temperature will result in a registration error of 100 nm, in circumstances where <10 nm is desired.

Thus, in order to mitigate overlay error it is desirable to prevent heating of the reticle. Transferring heat away from the reticle using fluids is not satisfactory because the use of cooling fluids is not practicable when considering the need to control precise positioning of the reticle (e.g., <10 nm) as it is scanned dynamically at speeds which may exceed one meter per second. Conventional radiative transfer and conduction cooling is typically inadequate because the temperature of the reticle is too close to ambient temperature, which runs contrary to radiative transfer and conduction cooling. Consequently, there is a need for a means to prevent the reticle from heating to a level where mechanical distortion may occur in order to mitigate overlay error.

SUMMARY OF THE INVENTION

The present invention provides for a system which facilitates controlling reticle temperature so as to mitigate overlay errors resulting from reticle heating. The system employs a plurality of thermoelectric coolers mounted on an opposite side of a backplate of a chuck assembly (employed to support the reticle during a lithographic process). Each thermoelectric cooler is responsible for cooling a particular portion of the reticle chuck, respectively. The cold side of the thermoelectric coolers are operatively coupled with the backplate, and the backplate thermally conducts heat between the reticle and the thermoelectric coolers. The hot side of the thermoelectric coolers are operatively coupled a heat sink, which draws heat away from the thermoelectric coolers, respectively. The reticle temperature is monitored by the system, and the thermoelectric coolers are selectively driven by the system so as to maintain reticle temperature at a desired level. As a result, mechanical distortion of the reticle due to heating is substantially prevented which in turn mitigates overlay error.

One particular aspect of the invention relates to a system for regulating reticle temperature. The system includes: at least one thermoelectric cooler operatively coupled to at least a portion of a reticle; a power source for powering the at least one thermoelectric cooler; and a processor operatively coupled to the power source, the processor controlling the at least one thermoelectric cooler so as to regulate temperature of at least the portion of the reticle.

Another aspect of the invention relates to a system for regulating reticle temperature which includes: a reticle for use in a lithographic process; and a chuck assembly for supporting the reticle. The chuck assembly includes: a backplate having front and back surfaces, the front surface engaging with a backside of the reticle; a thermoelectric cooling system operatively coupled to the backplate for regulating temperature of at least a portion of the reticle via heat conduction through the backplate; a temperature sensing system coupled to the backplate for sensing temperature of at least a portion of the reticle via heat conduction through the backplate; and a heat sink operatively coupled to the thermoelectric cooling system; The system also includes a voltage driver operatively coupled to the thermoelectric cooling system, the voltage driver providing a bias voltage to drive the thermoelectric cooling system; and a processor operatively coupled to the voltage driver, the processor employing the voltage driver in controlling the thermoelectric cooling system.

Yet another aspect of the present invention relates to a method for regulating reticle temperature including the step of using a processor controlled thermoelectric cooling system to conduct heat from a reticle.

Another aspect of the present invention relates to a system for regulating reticle temperature including at least one thermoelectric cooler operatively coupled to a wafer. The system also includes a power source for powering the at least one thermoelectric cooler; and a processor operatively coupled to the power source, the processor controlling the at least one thermoelectric cooler so as to regulate temperature of at least a portion of the wafer.

According to still another aspect of the present invention a method for regulating temperature of a reticle includes the steps of: partitioning the reticle into a plurality of grid blocks; using a plurality of thermoelectric coolers operatively coupled to the reticle to cool the reticle, each thermoelectric cooler functionally corresponding to a respective grid block; using a plurality of temperature sensors operatively coupled to the reticle, each temperature sensor functionally corresponding to a respective grid block; and using a processor to coordinate control of the thermoelectric coolers, respectively, in accordance with a lithography scanning protocol and sensed temperature of respective portions of the reticle.

Yet another aspect of the present invention relates to a system for regulating temperature of a reticle supported on a backplate of a chuck assembly. The system includes: means for thermally conducting heat away from a reticle via the backplate; and processing means for selectively controlling the thermally conducting means so as to regulate reticle temperature.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a perspective illustration of a backplate supporting a reflective reticle in accordance with the present invention;

FIG. 2 is a perspective illustration of a bottom side of the backplate of FIG. 1, wherein the bottom side includes a plurality of thermoelectric cooling devices distributed thereon in accordance with the present invention;

DETAILED DESCRIPTION OF THE INVENTION

Figure 3:
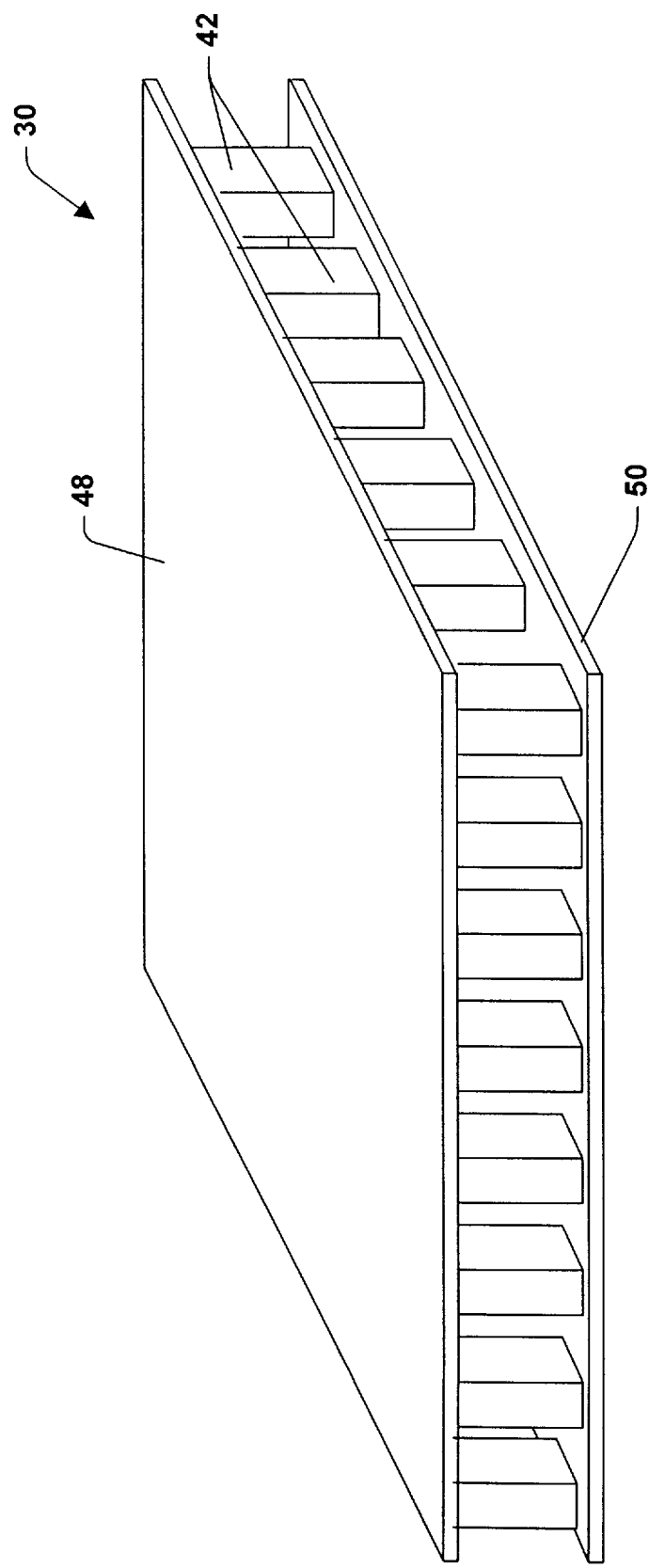
FIG. 3 is a perspective illustration of a thermoelectric cooler in accordance with the present invention.

The present invention will now be described with reference to the drawings, wherein like reference numerals are used to refer to like elements throughout. The method of the present invention will be described with reference to a system for controlling reflection reticle temperature using a plurality of thermoelectric coolers. The following detailed description is of the best modes presently contemplated by the inventors for practicing the invention. It should be understood that the description of these preferred embodiments are merely illustrative and that they should not be taken in a limiting sense. Although the invention is primarily described within the context of maintaining reticle temperature, it is to be appreciated that the present invention has wide applicability to other areas such as for example maintaining wafer temperature.

Referring initially to FIGS. 1 and 2, a backplate 20 is shown supporting a reflective reticle 22, which includes an imaging pattern 24. The backplate 20 is part of a chuck assembly 28 (FIG. 4) for supporting and positioning the reticle 22 during a lithographic process. FIG. 1 depicts a front side of the backplate 20 which the reticle 22 rests upon, and FIG. 2 illustrates the back side of the backplate which engages with the chuck assembly 28. As is known in the art, the front side of the backplate 20 provides for a substantially flat and rigid surface to support the reticle in order to facilitate the lithographic process. In addition, however, the backplate 20 is substantially thin (e.g., 1–10 mm) and is thermally conductive so as to transfer heat by conduction to and from the reticle 22. A plurality of thermoelectric coolers 30 are distributed on the bottom side of the backplate 20. The thermoelectric coolers 30 provide for heating and/or cooling the backplate 20 so as to regulate temperature of the reticle 22.

FIG. 3 is a perspective illustration of a thermoelectric cooler 30 which may be used in the plurality of thermoelectric coolers shown in FIG. 2. The thermoelectric cooler 30 includes a matrix of thermoelectric elements 42 formed of n-type and p-type semiconductor material. The thermoelectric elements 42 are connected electrically in series and thermally in parallel. The thermoelectric elements 42 are interposed between two ceramic plates 48, 50. The two ceramic plates 48, 50 define either a cold side 48 or hot side 50 depending on a dc voltage connection. With a positive dc voltage applied to an n-type thermoelement (not shown), electrons pass from a p-type thermoelement (not shown) to the n-type thermoelement and the cold side temperature will decrease as heat is absorbed. Cooling is proportional to current amplitude and the number of thermoelectric elements 42, and occurs when electrons pass from a low energy level in the p-type thermoelement to a higher energy level in the n-type thermoelement. The heat is then conducted through the n-type thermoelement to the hot side, and liberated as the electrons return to a lower energy level in the p-type thermoelement. To keep the thermoelectric cooler 30 working the hot side 50 is coupled to a heat sink 32 (FIG. 4) for heat removal or emitted radiativity.

Thus, the thermoelectric coolers (TECs) 30 act as heat pumps for transferring energy to and from the reticle 22 via the backplate 20. Regulating the direction and amount of current with the use of a feedback loop, for example, allows the TECs 30 to cool, heat or stabilize temperature of the reticle 22. Reversing the direction of current reverses the direction of heat pumping.

Returning back to FIG. 1, the reticle 22 is expected to be employed in a step-and-scan configuration wherein the entire reticle pattern 24 is exposed onto a wafer by synchronously scanning the reticle 22 and the wafer. Since only portions of the reticle 22 are scanned at a time, the portions undergoing scanning may become hotter than portions not being scanned currently. Consequently, the portion undergoing scanning may thermally distort as a result of thermal expansion thereof. By selectively dividing the reticle into grid blocks of a grid map, and providing each block with a respective thermoelectric electric cooler 30, each grid block portion of the reticle 22 may be individually regulated for temperature.

The rate of radiative emission from the hot side of the thermoelectric cooler 50 is proportional to:

$$\epsilon_A \epsilon_B (T_A^4 - T_B^4)$$

where:

$\epsilon_A$ is the emissivity of the material facing the hot side of the thermoelectric cooler;

$\epsilon_B$ is the emissivity of the material comprising the hot side of the thermoelectric cooler;

$T_A$ is the absolute temperature of the material facing the hot side of the thermoelectric cooler; and $T_B$ is the temperature of the hot side of the thermoelectric cooler.

The reticle 22 and the backplate 20 are in thermal contact, and the rate of heat transfer there between is proportional to $T_A - T_B$. Increasing the temperature difference between the reticle 22 and the backplate 20 increases the rate of heat transfer. The thermoelectric coolers 30 provide for such increase in temperature difference between $T_A$ and $T_B$, and facilitate heat transfer between the reticle 22 and backplate 20. The backside of the backplate 20 may be coated with a substantially high emissivity material ($\epsilon_B \approx 1$) which does not need to be selected on the basis of utility as an EUV optical material.

Figure 4:
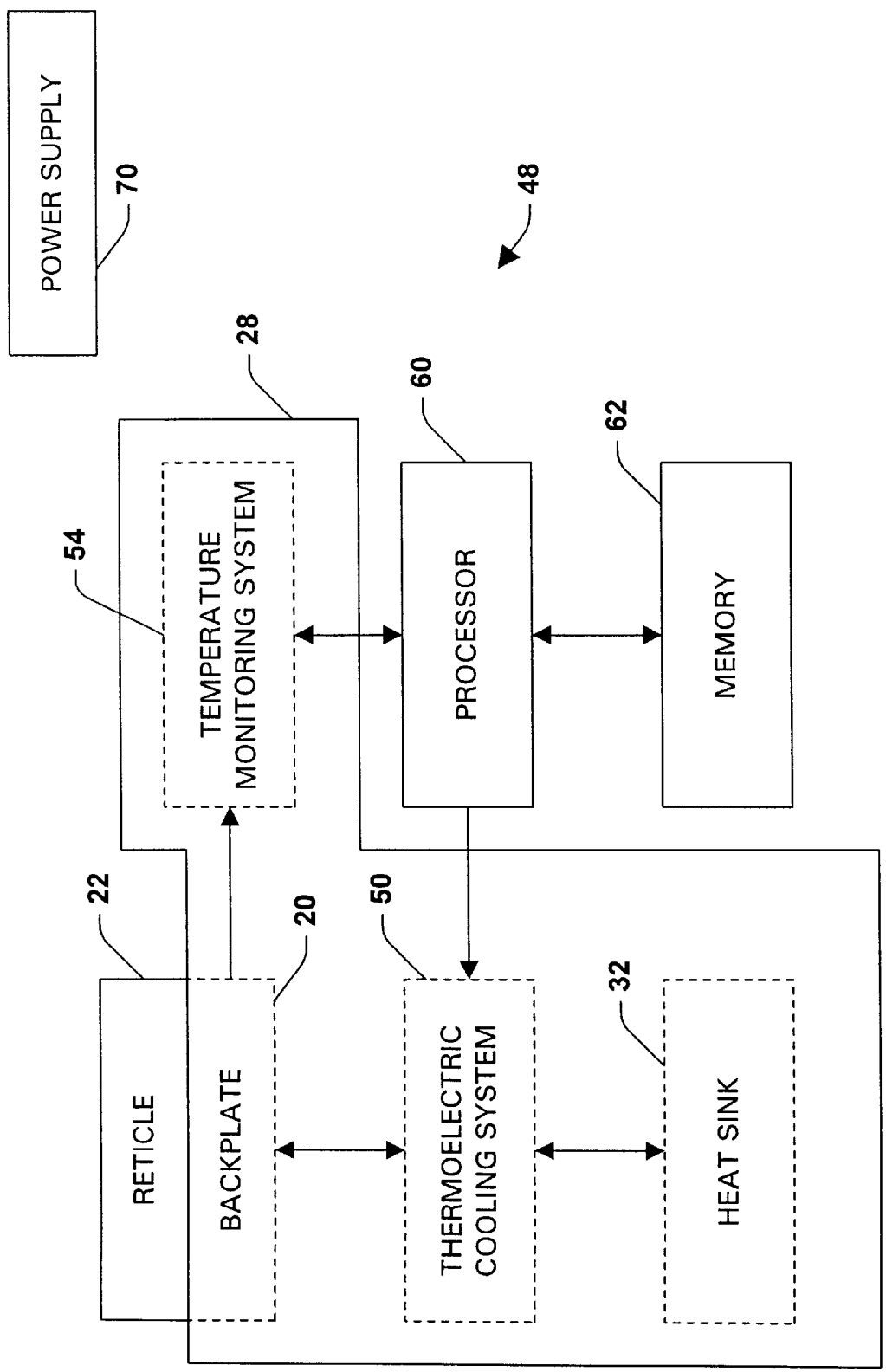
FIG. 4 is a schematic block diagram illustrating a system for controlling reticle temperature in accordance with the present invention.

FIG. 4 is a schematic block diagram of one specific embodiment of a reticle temperature regulation system 48 in accordance with the present invention. The system 48 includes the chuck assembly 28, which includes a thermoelectric cooling system 50 operatively coupled to the backplate 20 that supports the reticle 22. The thermoelectric cooling system 50 preferably consists of a plurality of thermoelectric coolers such as that described above and dc voltage sources for driving the thermoelectric coolers, respectively. The thermoelectric cooling system 50 is operatively coupled to the heat sink 32, which draws heat away from the thermoelectric cooling system 50. A processor 60 is operatively coupled to the thermoelectric cooling system 50 and is programmed to control and operate the various components within the reticle temperature regulation system 48 in order to carry out the various functions described herein. The processor or CPU 60 may be any of a plurality of processors, such as the AMD K6 and other similar and compatible processors. The manner in which the processor 60 can be programmed to carry out the functions relating to the present invention will be readily apparent to those having ordinary skill in the art based on the description provided herein.

A temperature monitoring system 54 is operatively coupled to the processor 60 and the reticle 22 (via the backplate 20). The temperature monitoring system 54 operates to monitor temperature of the reticle, preferably at a plurality of portions of the reticle 22. Temperature data relating to the reticle portions are provided to the processor 60 which employs these data in controlling the thermoelectric cooling system 50 to regulate reticle temperature. Any suitable temperature monitoring system (e.g., plurality of thermistors or other suitable temperature sensors (see FIG. 5)) may be employed to carry out the present invention and is intended to fall within the scope of the hereto appended claims.

A memory 62 which is coupled to the processor 60 is also included in the system 48 and serves to store program code executed by the processor 60 for carrying out operating functions of the system 48 as described herein. The memory 62 includes read only memory (ROM) and random access memory (RAM). The ROM contains among other code the Basic Input-Output System (BIOS) which controls the basic hardware operations of the system 48. The RAM is the main memory into which the operating system and application programs are loaded. The memory 62 also serves as a storage medium for temporarily storing information such as reticle temperature, temperature tables, reticle coordinate tables, thermoelectric cooler information, and other data which may be employed in carrying out the present invention. For mass data storage, the memory 62 may include a hard disk drive (e.g., 10 Gigabyte hard drive).

Power supply 70 provides operating power to the system 48. Any suitable power supply (e.g., battery, line power) may be employed to carry out the present invention.

Figure 5:
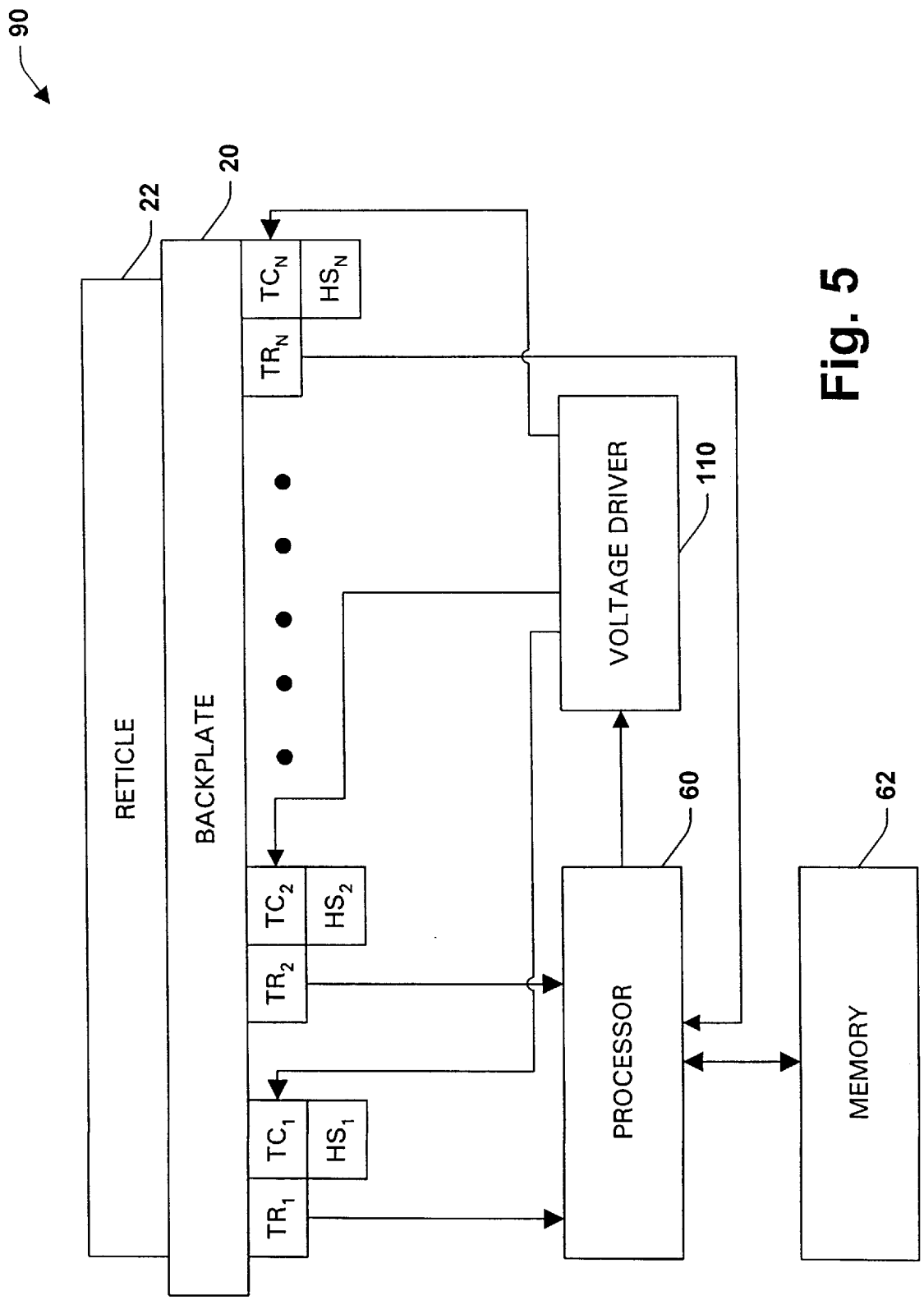
FIG. 5 is detailed schematic diagram illustrating another system for controlling reticle temperature in accordance with the present invention.

FIG. 5 is a detailed schematic block diagram of a reticle temperature regulation system 90 in accordance with the present invention. Like components between the embodiments of FIGS. 4 and 5 include like reference numerals and detailed discussion related to those like components is not repeated for sake of brevity. The system 90 includes a plurality of thermoelectric coolers ($TC_1$, $TC_2$ . . . $TC_N$), wherein "N" is an integer. The thermoelectric coolers TC are preferably distributed along the back side of the backplate 20 so as to uniformly cover the backplate 20. Each thermoelectric cooler TC provides temperature regulation to a predetermined portion of the backplate 20, respectively, which in turn provides temperature regulation to the reticle 22 resting on the front side of the backplate 20.

A plurality of heat sinks ($HS_1$, $HS_2$, . . . $HS_N$) are provided, wherein each heat sink HS is operatively coupled to a corresponding thermoelectric cooler TC, respectively, to draw heat away from the thermoelectric cooler TC.

The system 90 also includes a plurality of thermistors ($TR_1$, $TR_2$, . . . $TR_N$), wherein "N" is an integer to provide temperature monitoring of the reticle 22 via the backplate 20. Each thermoelectric cooler TC has a corresponding thermistor TR for monitoring temperature of the respective portion of the backplate 20 being temperature regulated by the corresponding thermoelectric cooler 20. It is to be appreciated that the thermistor TR may be integrated with the thermoelectric cooler TC as disclosed in U.S. Pat. No. 5,522,225 the entirety of which is incorporated herein by reference.

Each thermistor TR is operatively coupled to the processor 60 to provide the processor 60 with temperature data relating to the portion of the reticle 22 the thermistor TR is monitoring, respectively. Based on the information received from the thermistors as well as other information (e.g., lithography scanning and timing data), the processor 60 drives the voltage driver 110 operatively coupled thereto to control the thermoelectric coolers in a desired manner in order to regulate the temperature of the reticle 22.

Figure 6:
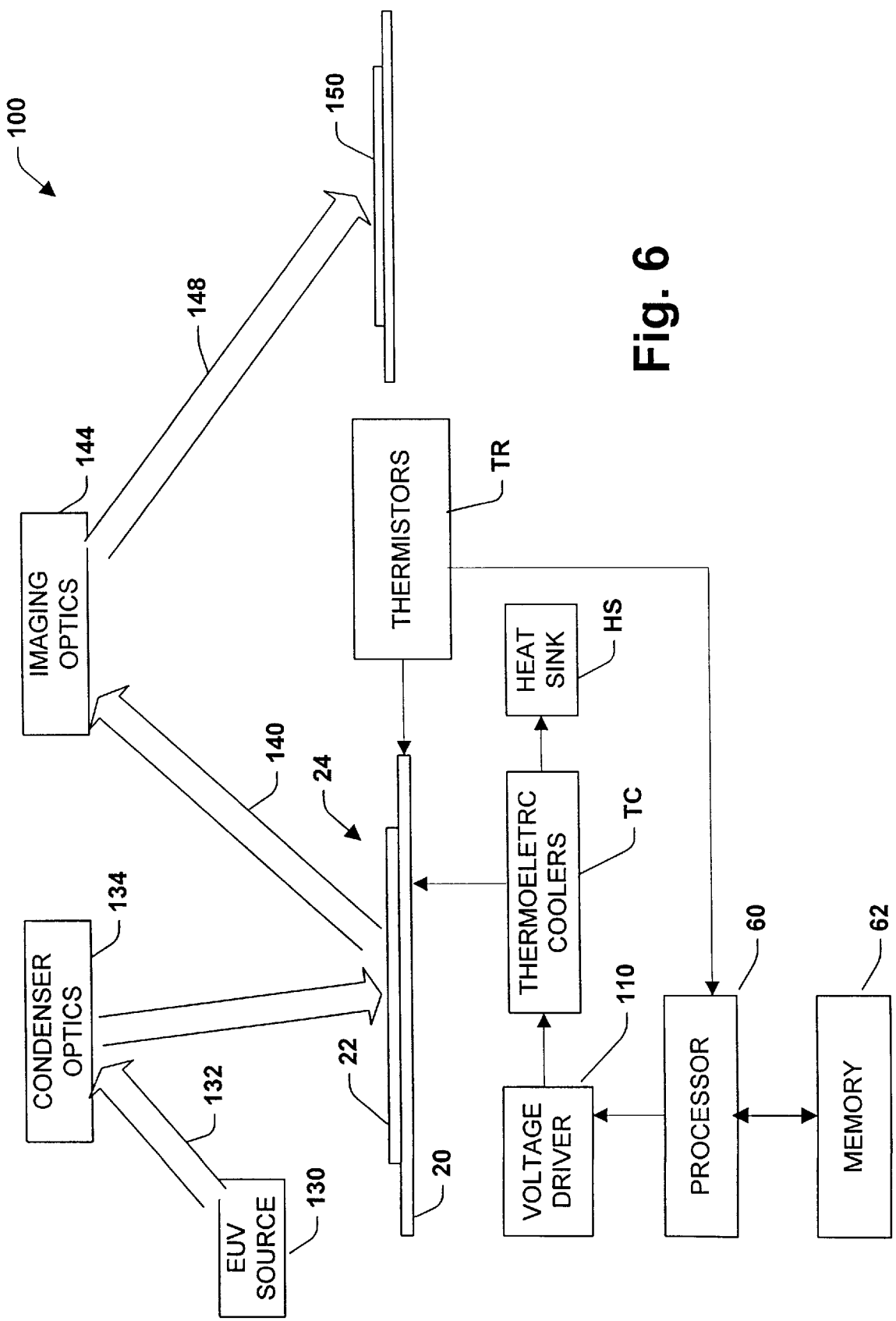
FIG. 6 is a schematic block diagram of a EUV lithography system employing a reticle temperature control system in accordance with the present invention.

Turning now to FIG. 6, a schematic block diagram is shown of the reticle temperature regulation system 90 being employed in connection with an extreme ultraviolet lithography (EUVL) system 100 in accordance with the present invention. The EUVL system 100 includes a EUV source 130, which may be a laser-produced plasma source. It is to be appreciated that any suitable source of EUV may be employed and is intended to fall within the scope of the hereto appended claims. An all reflective EUV condenser optical system 134 collects the EUV radiation 132 and projects it onto the resonant-reflective reticle 22. The reflected EUV radiation 140 carries the IC pattern (not shown) printed on the reticle 22 to the all resonant-reflective imaging system (imaging optics) 144. The imaging optics 144 projects a demagnified image 148 of the reticle pattern onto a resist coated wafer 150. The entire reticle pattern 24 is exposed onto the wafer 150 by synchronously scanning the mask (reticle) 22 and the wafer 150 (i.e., a step-and-scan exposure).

The reticle temperature regulation system 90 provides for regulating the temperature of the reticle 22 during the above described lithographic process in order to substantially prevent mechanical distortion of the reticle 22 due to heating, which in turn mitigates overlay error. In performing the reticle temperature regulation, the processor 60 controls the thermoelectric coolers individually to regulate temperature of predetermined portions of the reticle 22. The reticle 22 may be divided into a grid pattern as that shown in FIG. 7. Each grid block (XY) of the grid pattern corresponds to a particular portion of the reticle 22, and each portion is individually monitored for temperature as well as controlled for temperature.

The processor 60 controls the thermoelectric coolers 60 based upon at least the EUV scanning protocol employed by the EUVL system 100 as well as the measured temperature of the reticle portions. Simply monitoring reticle temperature is not sufficient because mechanical distortion of the reticle 22 may already have occurred to the reticle 22 by the time the processor 60 determines an undesired temperature level exists at a portion of the reticle 22. Thus, by coordinating thermoelectric cooler activation with the EUV scanning protocol, the processor 60 can initiate cooling of respective portions of the reticle 22 via the thermoelectric coolers TC prior to the scanning beam striking the portions. Coordinating such with temperature monitoring of the reticle portions (XY) via thermistors TR, for example, results in reliable regulation of reticle temperature.

Figures 7, 8:
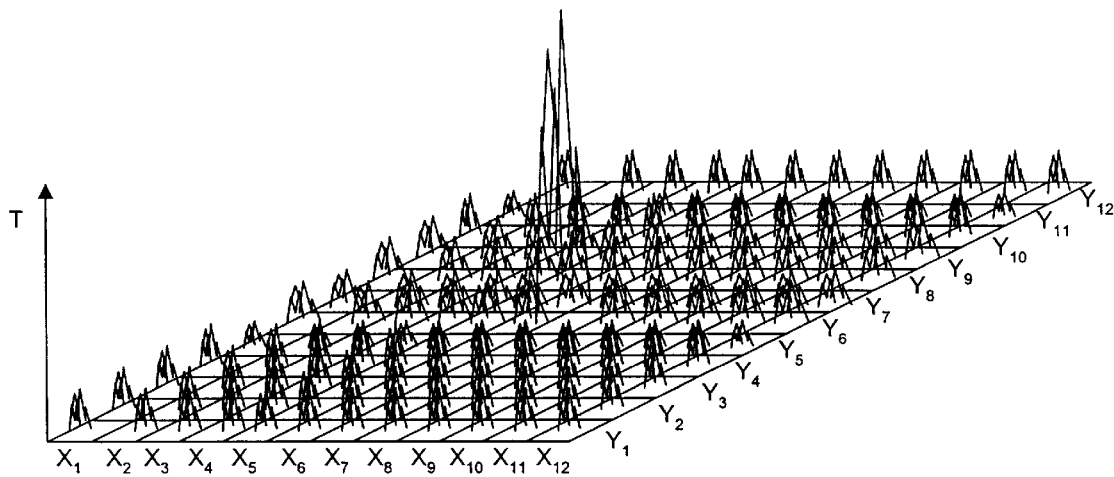
FIG. 7 is a representative three-dimensional grid map of a backplate for supporting a reticle illustrating temperature amplitudes taken at grid blocks of the grid map in accordance with the present invention.
FIG. 8 is a temperature amplitude table correlating the temperature amplitudes of FIG. 7 with desired values for the temperature amplitudes in accordance with the present invention.

In FIG. 7, each respective portion of the reticle ($X_1Y_1$ ... $X_{12}Y_{12}$) is being monitored for temperature by a respective thermistor ($TR_{1,1}$ ... $TR_{12,12}$). The temperature amplitudes of each reticle portion is shown. As can be seen, the temperature of the reticle at coordinate $X_7Y_6$ is substantially higher than the temperature of the other reticle portions XY. It is to be appreciated that although FIG. 7 illustrates the reticle 22 being mapped (partitioned) into 144 grid block portions, the reticle 22 may be mapped with any suitable number of portions.

FIG. 8 is a representative table of temperature amplitudes (taken at the various grid blocks which have been correlated with acceptable temperature amplitude values for the portions of the reticle 22 mapped by the respective grid blocks. As can be seen, all of the grid blocks except grid block $X_7Y_6$ have temperature amplitudes corresponding to an acceptable temperature value ($T_A$) (e.g., are within an expected range of temperature amplitudes), while grid block $X_7Y_6$ has an undesired temperature value ($T_U$). Thus, the processor 60 has determined that an undesirable temperature condition exists at the portion of the reticle 22 mapped by grid block $X_7Y_6$. Accordingly, the processor 60 can drive the thermoelectric cooler $TC_{7,6}$ which corresponds to the portion of the reticle 22 mapped at grid block $X_7Y_6$ so as to bring the temperature of this portion of the reticle 22 down to an acceptable level.

Figure 9:
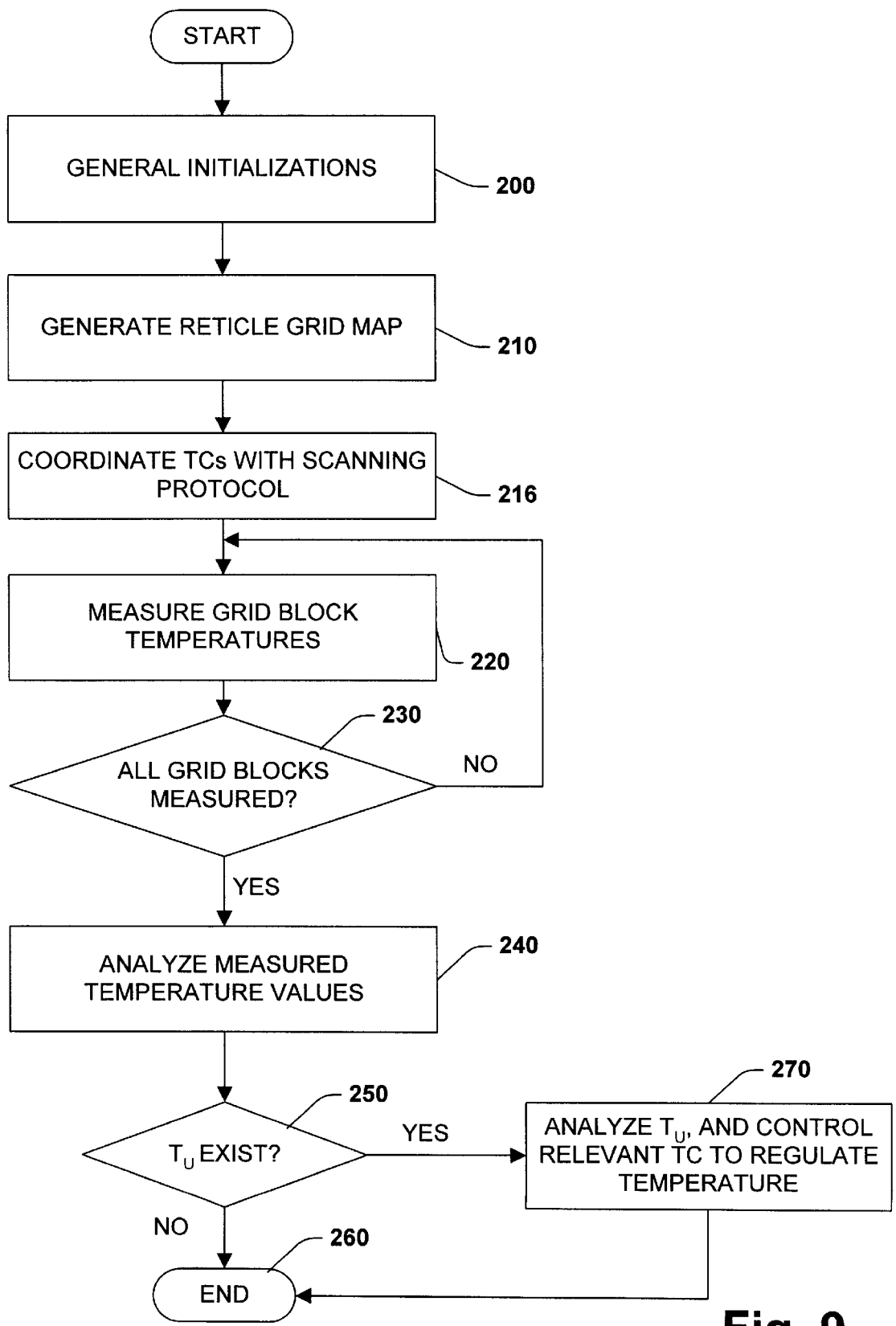
FIG. 9 is a flow diagram illustrating one specific methodology for carrying out the present invention.

FIG. 9 is a flow diagram illustrating one particular methodology for carrying out the present invention. In step 200, the processor 60 performs general initializations to the reticle temperature regulation system 90. In step 210, the processor 60 maps at least a portion of the reticle 22 into a plurality of grid blocks "XY". In step 216, the processor 60 coordinates selective activation and control of the thermoelectric coolers TC in accordance with a scanning protocol being employed by the EUVL system 100. In step 220, temperature measurements are taken which correspond to the respective grid blocks XY. In step 230, the processor 60 determines if all grid block measurements have been taken. If no, the processor 60 returns to step 220. If yes, the processor 60 analyzes the measured temperature values against a table of acceptable temperature levels for the respective portions of the reticle 22. In step 250, the processor 60 determines if any grid block temperature values are not acceptable. If all values grid block temperature values are acceptable, the processor 60 ends this particular iteration of the present methodology. If unacceptable temperature values are found for any of the grid blocks, the processor 60 advances to step 270 where the unacceptable temperature values are analyzed. After the analyses, the processor 60 controls relevant thermoelectric coolers (which correspond to the grid blocks with unacceptable temperature values) to regulate the temperature of the respective reticle portions to an acceptable level. The iteration of this methodology is then ended at step 260.

Figure 10:
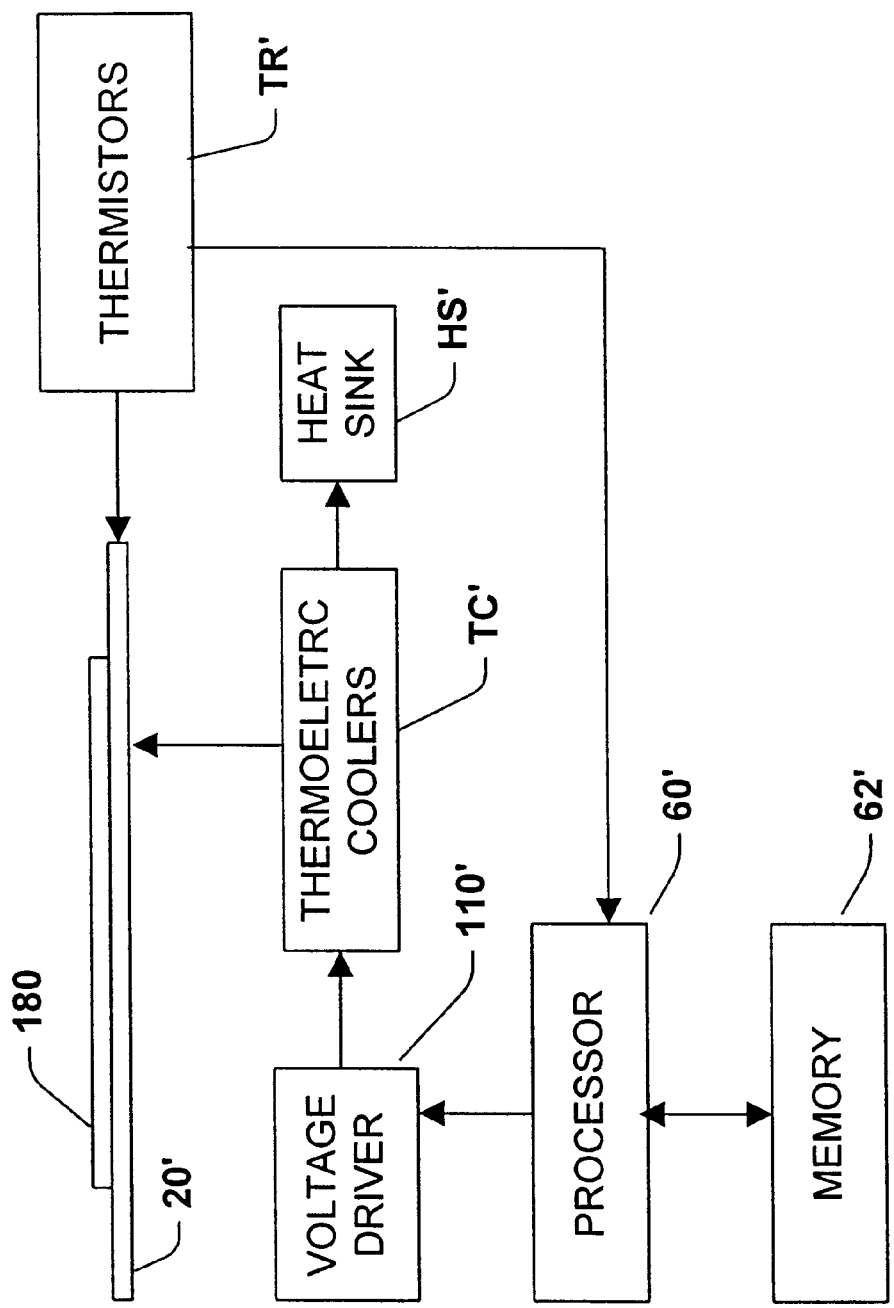
FIG. 10 is a schematic block diagram of a wafer temperature control system in accordance with the present invention.

It is to be appreciated that the present invention may be applied to regulate temperature of articles other than the reticle 22. For example, as shown in FIG. 10, a temperature regulation system 90' (similar to the reticle temperature regulation system 90) is being employed to regulate the temperature of a wafer 180. Like components between systems 90' and 90 include like reference numerals except that the reference numerals of those like components relating to system 90' are followed by a prime ('). Further detailed discussion relating to the like components is omitted for sake of brevity. The system 90' provides for monitoring and regulating temperature of portions of the wafer in a manner substantially similar to the embodiments described above directed to regulating reticle temperature. It is to be appreciated that the present disclosure is intended to include any of the above embodiments (or combination thereof) relating to regulating reticle temperature as suitably applied to regulating wafer temperature, and such embodiments are intended to fall within the scope of the hereto appended claims.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for regulating reticle temperature, comprising:
   a plurality of thermoelectric coolers operatively coupled to a reticle;
   a power source for powering the plurality of thermoelectric coolers; and
   a processor operatively coupled to the power source, the processor mapping the reticle into a plurality of grid blocks, each thermoelectric cooler being associated with a respective grid block of the plurality of grid blocks, the processor controlling the thermoelectric coolers so as to selectively regulate temperature of portions of the reticle.

2. The system of claim 1 further including at least one temperature sensor for sensing temperature of at least one of the portions of the reticle.

3. The system of claim 1, further including a thermally conductive material interposed between at least one of the thermoelectric coolers and the reticle.

4. The system of claim 1, further including at least one heat sink for removing heat from at least one of the thermoelectric coolers.

5. The system of claim 2, the processor operatively coupled to the temperature sensor, the processor analyzing reticle temperature data received from the at least one temperature sensor, and basing control of at least one of the thermoelectric coolers at least partially on the analyzed reticle temperature data.

6. A system for regulating reticle temperature, comprising:
   at least one thermoelectric cooler operatively coupled to a reticle;
   a power source for powering the at least one thermoelectric cooler; and
   a processor operatively coupled to the power source, the processor controlling at least one thermoelectric cooler so as to regulate temperature of at least a portion of the reticle, the processor mapping the reticle into a plurality of grid blocks; and
   at least one temperature sensor for sensing temperature of the at least a portion of the reticle, the at least one temperature sensor making a temperature measurement at a grid block;
   wherein the processor determines the existence of an unacceptable temperature for at least a portion of the reticle based upon the measured temperature differing from an acceptable value.

7. The system of claim 6, wherein the processor determines the existence of an unacceptable temperature for at least a portion of the reticle based upon the measured temperature differing from an acceptable value.

8. The system of claim 6, wherein the processor activates the thermoelectric cooling system to regulate the temperature of the reticle portion to an acceptable value.

9. A system for regulating reticle temperature, comprising:
   a reticle for use in a lithographic process;
   a chuck assembly for supporting the reticle, the chuck assembly including:
      a backplate having front and back surfaces, the front surface engaging a backside of the reticle;
      a thermoelectric cooling system operatively coupled to the backplate for regulating temperature of at least a portion of the reticle via heat conduction through the backplate;
      a temperature sensing system operatively coupled to the backplate for sensing temperature of at least a portion of the reticle via heat conduction through the backplate;
      a heat sink operatively coupled to the thermoelectric cooling system;
   a voltage driver operatively coupled to the thermoelectric cooling system, the voltage driver providing a bias voltage to drive the thermoelectric cooling system;
   a processor operatively coupled to the voltage driver, the processor employing the voltage driver in controlling the thermoelectric cooling system; and
   a memory storing at least a table of acceptable temperature ranges for the reticle.

10. The system of claim 9, wherein the processor maps the reticle into a plurality of grid blocks, and the temperature sensing system makes a temperature measurement at at least one grid block.

11. The system of claim 10, wherein the processor determines the existence of an unacceptable temperature for at least a portion of the reticle based upon the measured temperature differing from an acceptable value.

12. The system of claim 11, wherein the processor activates the thermoelectric cooling system to regulate the temperature of the reticle portion to an acceptable value.

13. A method for regulating reticle temperature, comprising the step of:
   using a processor controlled thermoelectric cooling system to conduct heat from a reticle; and
   using a plurality of thermistors, each thermistor sensing temperature relating to a different respective portion of the reticle.

14. The method of claim 13, further including the step of using a chuck assembly backplate to support the reticle, the backplate being interposed between the reticle and the thermoelectric cooling system, and the backplate thermally conducting heat between the reticle and thermoelectric cooling system.

15. A method for regulating reticle temperature, comprising the step of:
   using a processor controlled thermoelectric cooling system to conduct heat from a reticle; and
   using the processor to control the thermoelectric cooling system so as to initiate cooling of a portion of the reticle prior to the portion being scanned by an energy source.

16. The method of claim 15, further including the step of using the processor to coordinate control of the thermoelectric cooling system based on a lithography scanning protocol and measured reticle temperature.

17. A system for regulating wafer temperature, comprising:
   at least one thermoelectric cooler operatively coupled to a wafer;
   a power source for powering the at least one thermoelectric cooler;

at least one temperature sensor for sensing temperature of at least a portion of the wafer; and a processor operatively coupled to the power source, the processor mapping the wafer into a plurality of grid blocks, the at least a portion of the wafer being associated with at least one of the grid blocks, the processor controlling the at least one thermoelectric cooler so as to regulate temperature of the at least a portion of the wafer.

18. The system of claim 17, further including a thermally conductive material interposed between the at least one thermoelectric cooler and the wafer.

19. The system of claim 17, further including at least one heat sink for removing heat from the at least one thermoelectric cooler.

20. The system of claim 17, the processor being operatively coupled to the at least one temperature sensor, the processor analyzing wafer temperature data received from the at least one temperature sensor, and basing control of the at least one thermoelectric cooler at least partially on the analyzed wafer temperature data.

21. The system of claim 17, the processor mapping the wafer into a plurality of grid blocks, and the at least one temperature sensor making a temperature measurement at a grid block.

22. The system of claim 21, wherein the processor determines the existence of an unacceptable temperature for at least a portion of the wafer based upon the measured temperature differing from an acceptable value.

23. The system of claim 22, wherein the processor controls the thermoelectric cooling system to regulate the temperature of the wafer portion to an acceptable value.

24. A method for regulating temperature of a reticle, comprising the steps of:

partitioning the reticle into a plurality of grid blocks;

using a plurality of thermoelectric coolers operatively coupled to the reticle to cool the reticle, each thermoelectric cooler functionally corresponding to a respective grid block;

using a plurality of temperature sensors operatively coupled to the reticle, each temperature sensor functionally corresponding to a respective grid block; and using a processor to coordinate control of the thermoelectric coolers, respectively, in accordance with a lithography scanning protocol and sensed temperature of respective portions of the reticle.

25. A system for regulating temperature of a reticle supported on a backplate of a chuck assembly, comprising:

means for sensing temperature of at least a one portion out of a plurality of portions of the reticle;

means for thermally conducting heat away from the reticle via the backplate; and processing means for mapping the reticle into the plurality of portions and for selectively controlling the thermally conducting means so as to regulate temperature of the at least one portion of the reticle.

* * * * *